United States Patent [19]
Yoshida et al.

[11] Patent Number: 5,968,592
[45] Date of Patent: Oct. 19, 1999

[54] MULTI STEP COAT

[75] Inventors: Masataka Yoshida, Tokyo; Tomoaki Mekata, Tsuchiura, both of Japan

[73] Assignee: Texas Instruments Incorporated, Dallas, Tex.

[21] Appl. No.: 08/929,263

[22] Filed: Sep. 11, 1997

[30] Foreign Application Priority Data

Sep. 13, 1996 [JP] Japan ..................................... 8-265476

[51] Int. Cl.$^6$ ........................................................ B05D 3/12
[52] U.S. Cl. ........................ 427/240; 427/385.5; 437/231
[58] Field of Search ................................ 427/240, 385.5; 437/231

[56] References Cited

U.S. PATENT DOCUMENTS

| | | | |
|---|---|---|---|
| 4,267,212 | 5/1981 | Sakawaki | 427/240 |
| 5,238,878 | 8/1993 | Shinohara | 427/240 |

*Primary Examiner*—Janyce Bell
*Attorney, Agent, or Firm*—William B. Kempler; Richard L. Donaldson

[57] ABSTRACT

The objective of the invention is to provide a resist material deposition method which allows reliable deposition using a small amount of resist material without unevenness.

The method of the present invention comprises the following processing steps: a first processing step in which the resist material is fed to the central portion of the semiconductor substrate, and a second processing step in which the aforementioned semiconductor substrate is rotated at a high velocity so that the aforementioned resist material spreads out smoothly toward the circumferential portion of the aforementioned semiconductor substrate. In the first processing step, the semiconductor substrate is rotated at a velocity in the range of 1000–1500 rpm; in the second processing step, the semiconductor substrate is rotated at a velocity in the range of 3000–3800 rpm.

21 Claims, 6 Drawing Sheets

[Document name] FIGS.

FIG. 1

Key: 1  Rotational velocity
     2  Time (sec)

FIG. 2

Key: 1   Rotational velocity
     2   Time (sec)

Key: 1    Rotational velocity
     2    Time (sec)

FIG. 6

A MULTI STEP COAT

FIELD OF THE INVENTION

The present invention pertains to a resist material deposition method on Si wafer or another semiconductor substrate for use in semiconductor devices.

BACKGROUND OF THE INVENTION

Usually, in the manufacturing process of semiconductor devices, there is a processing step in which the resist is deposited as a photomask for exposure on Si or another semiconductor substrate. In this processing step, for example, in the case of an 8-in Si wafer, the resist material is deposited as shown in FIGS. 5 and 6.

Figure 5:
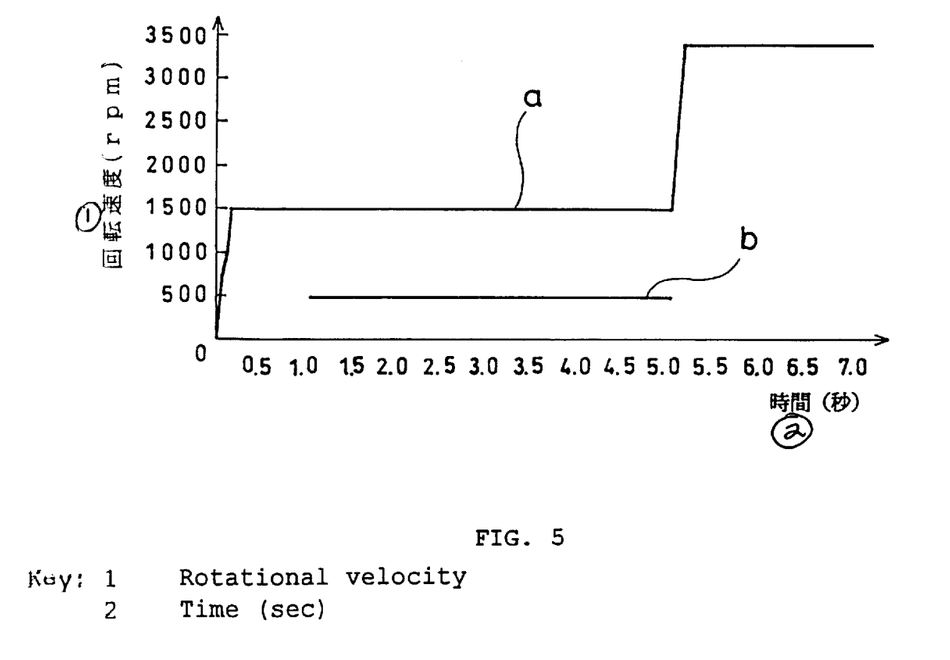
FIG. 5 is a diagram illustrating the relationship between the rotational velocity of the semiconductor substrate and the deposition time of the resist material.
Figure 6:
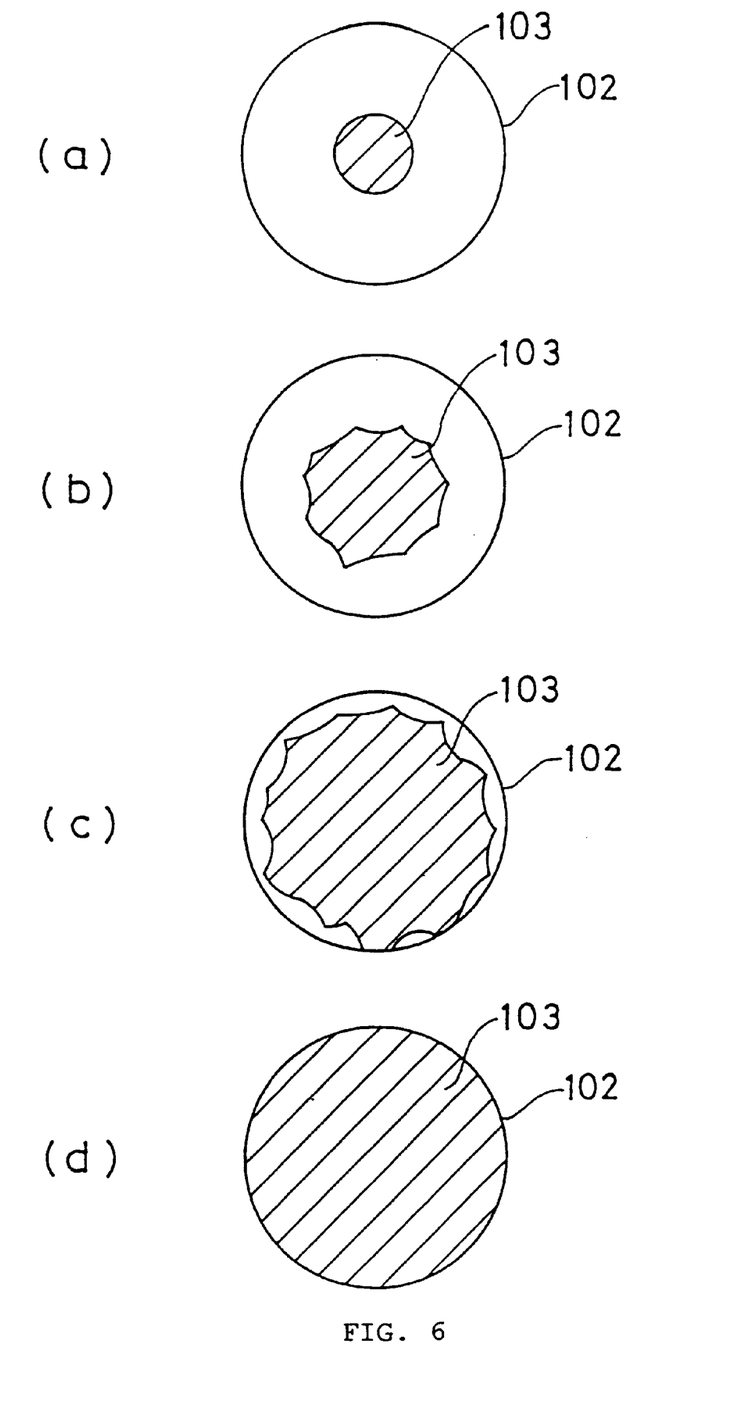
FIGS. 6(a), 6(b), 6(c) and 6(d) illustrates schematically the deposition process of the resist material of the prior art.

As shown in graph a in FIG. 5, first the semiconductor substrate 102 is rotated at a constant velocity of 1500 rpm. As shown in graph b, about 1 sec after the start of rotation, feeding of resist material 103 to the central portion of semiconductor substrate 102 is initiated (FIG. 6(a).

As resist material 103 is fed while semiconductor substrate 102 is rotated at the velocity for about 4 sec, resist material 103 spreads toward the circumferential portion of semiconductor substrate 102 as shown in FIGS. 6(b)–(d).

Then, as the supply of resist material 103 is stopped, the rotational velocity of semiconductor substrate 102 is raised to 3500 rpm, and the resist film is deposited.

By using this method, it is possible to form a resist film with a nearly uniform film thickness on semiconductor substrate 102.

However, in the conventional deposition method, in order to deposit resist material 103 over the entire surface of semiconductor substrate 102 without any unevenness, a significant amount of resist material 103 is required. As a result, the manufacturing cost of the semiconductor devices increases.

On the other hand, if the amount of resist material 103 supplied is reduced in the aforementioned conventional method, the resist material may be applied unevenly, making reliable deposition impossible. This is a disadvantage.

The purpose of the present invention is to solve the aforementioned problems of the conventional methods by providing a resist material deposition method which enables reliable deposition with a small amount of resist material, free of unevenness.

SUMMARY OF INVENTION

In order to realize the aforementioned purpose, the provides a method of depositing a resist material on a semiconductor wafer comprising the steps of placing a resist material at a central portion of said semiconductor wafer; spinning said wafer at a first speed for a first predetermined time; spinning said wafer at a second speed which is less than said first speed for a second predetermined time; and spinning said wafer at a third speed, said third speed being between said first and second speeds for a third predetermined time, whereby said resist material is evenly spread across said wafer.

In the following, the resist material deposition method of the present invention will be explained in more detail with reference to embodiments illustrated in the FIGS.

Figure 4:
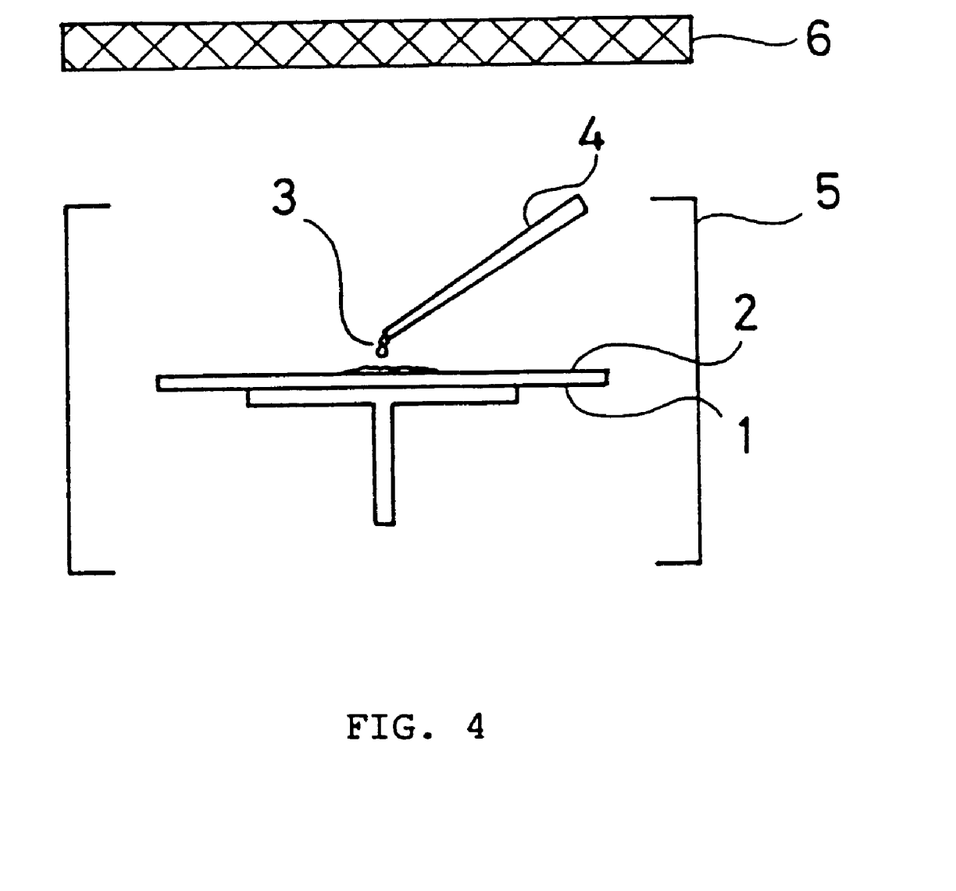
FIG. 4 is a schematic diagram illustrating the constitution of the resist material coating device used in the embodiment of the present invention.

FIG. 4 is a diagram schematically illustrating the constitution of the resist material deposition device of an embodiment of the present invention.

This device is set inside a container (not shown in the FIG.) that can maintain the prescribed temperature and humidity.

As shown in FIG. 4, this device has chuck 1 which can be rotated at the prescribed rotational velocity by a motor or other rotary driving source not shown in the FIG. Si wafer or another semiconductor substrate 2 is mounted in said chuck 1. A resist material 3 is fed from a nozzle on the end of arm 4 and deposited on semiconductor substrate 2. The arm is arranged such that it can move in the radial direction of semiconductor substrate 2 from the center of rotation of semiconductor substrate 2 to any given position above semiconductor substrate 2. In addition, a receiving portion 5 is arranged on the circumference of semiconductor substrate 2 for receiving the resist material 3 that spins off during rotation of semiconductor substrate 2.

Also, filter 6 for removing dust from the room is arranged to remove dust from the chamber. Also, although not shown in the FIG., an arm for feeding the detergent solution for washing the edge of semiconductor substrate 2 is also arranged.

Also, when this device is used to deposit resist material 3, for example, the temperature of resist material 3 and the ambient temperature are maintained at room temperature (about 23° C.) and the humidity at about 41%.

In the following, a preferred embodiment of the resist material deposition method in the present invention will be explained.

Figure 1:
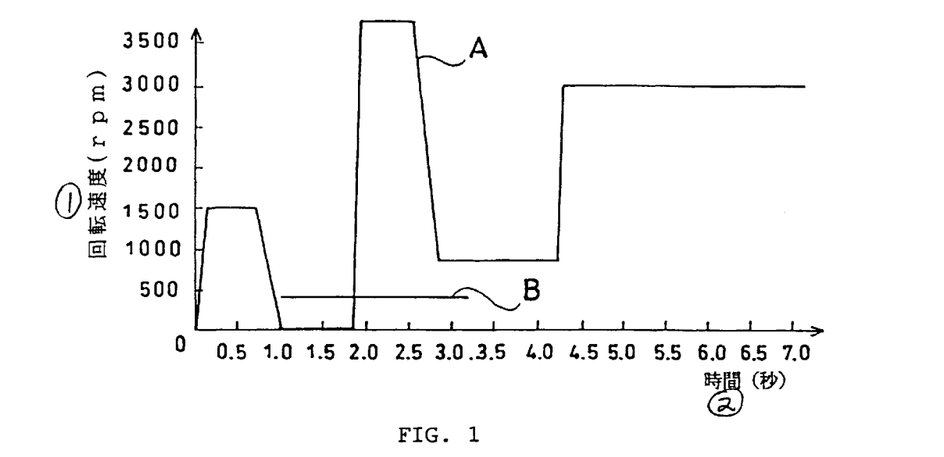
FIG. 1 is a diagram illustrating the relationship between the rotational velocity of the semiconductor substrate and the deposition time of the resist material in a preferred embodiment of the present invention.
Figure 2:
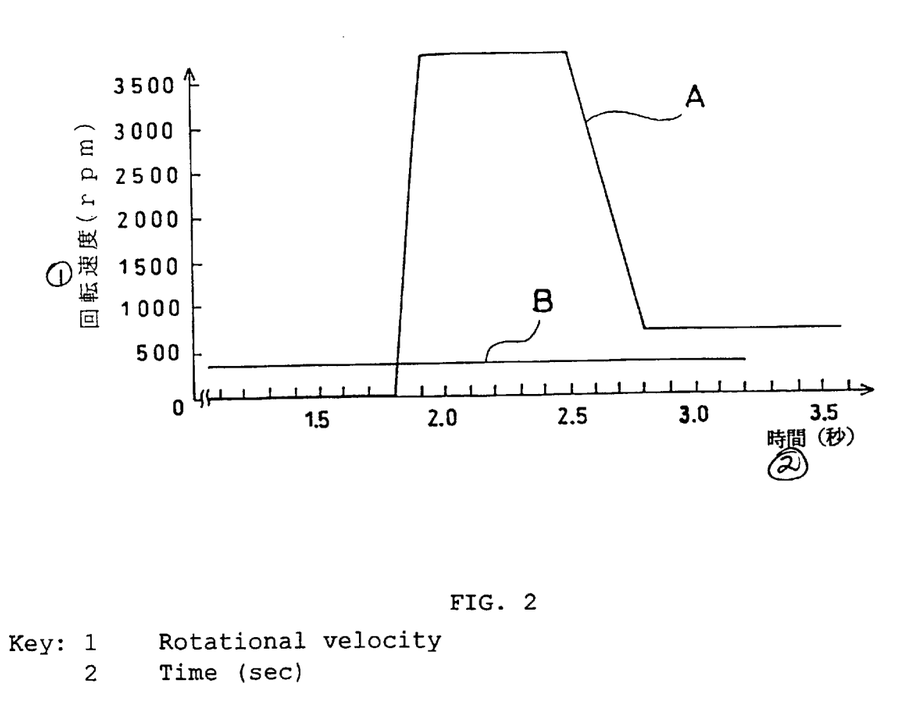
FIG. 2 is an enlarged view of the main portion of FIG. 1.

FIG. 1 is a graph illustrating the relationship between the rotational velocity of semiconductor substrate 2 and the deposition time of the resist material. FIG. 2 is an enlarged view of the main portion of FIG. 1.

In FIGS. 1 and 2, the case of depositing resist material on an 8-inch semiconductor substrate 2 is illustrated. Graph A indicates the rotational velocity of semiconductor substrate 2, and graph B indicates the coating time of resist material 3.

As shown in FIGS. 1 and 2, first, semiconductor substrate 2 is rotated at a low velocity (about 1500 rpm). for about 1 sec so as to remove dust, etc., adhered to semiconductor substrate 2. In this processing step, resist material 3 is not ejected as arm 4 is moved to the central portion of semiconductor substrate 2.

Then, the rotational velocity of semiconductor substrate 2 is reduced, and the rotation finally halted. Resist material 3 is then fed from the end of arm 4 at a prescribed rate (about 0.9 cm³/sec) to the central portion of semiconductor substrate 2.

Figure 3:
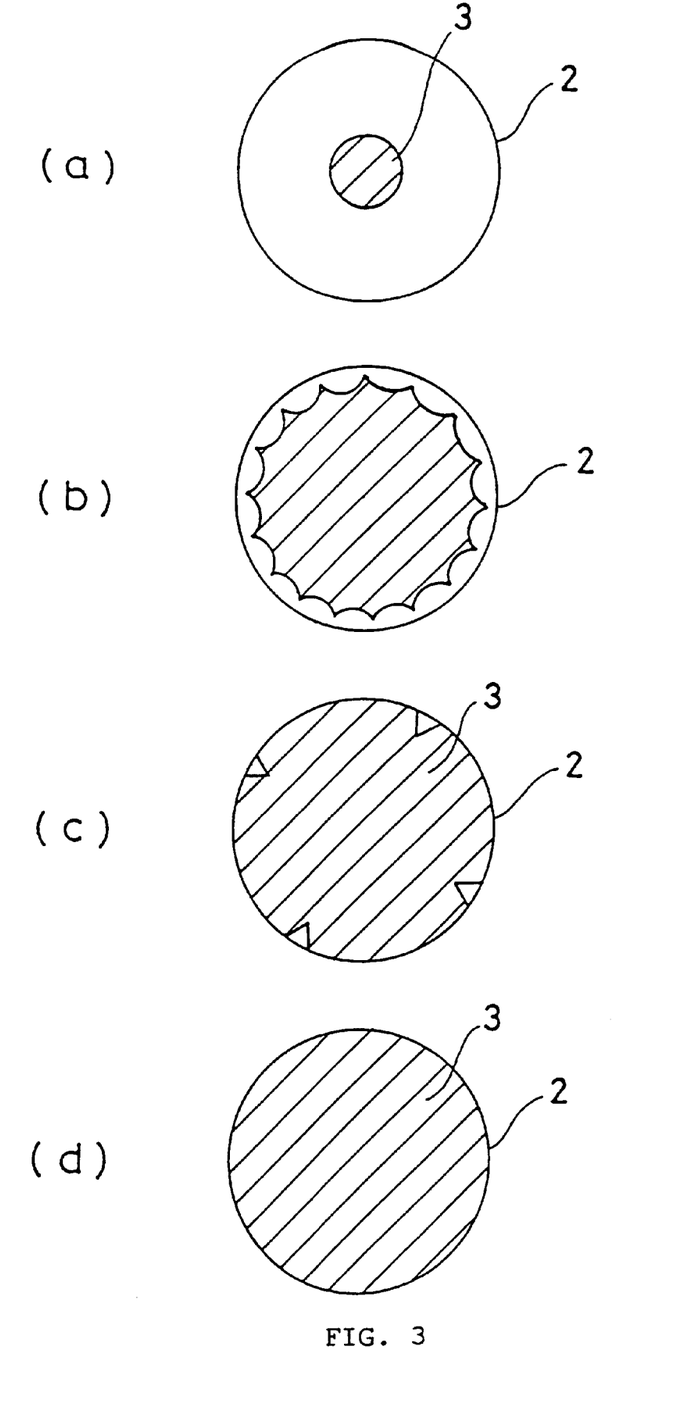
FIGS. 3(a), 3(b), 3(c) and 3(d) illustrates schematically the deposition process of the resist material in this embodiment.

As a result, resist material 3 accumulates at the central portion of semiconductor substrate 2 as shown in FIG. 3(a).

Then, while the feeding of resist material 3 continues, after about 1.8 sec from the start of operation, semiconductor substrate 2 begins to be rotated at a high velocity (about 3000–3800 rpm) for about 1 sec.

As a result, as shown in FIG. 3(b), resist material 3 spreads toward the circumferential portion of semiconductor substrate 2. In addition, as shown in FIG. 3(c), resist material 3 is deposited smoothly on almost the entire surface up to the circumferential portion of semiconductor substrate 2.

Also, when semiconductor substrate 2 is rotated at a velocity of 4000 rpm or more, spun resist material 3 may bounce back from receiving portion 5 and the flatness of the resist film may deteriorate.

Then, the feeding of resist material 3 continues, while the rotational velocity of semiconductor substrate 2 is reduced (to about 800 rpm) and rotation is carried out for about 0.4 sec. Then, the feeding of resist material 3 is stopped after about 3.2 sec from the start of the process. In this way, as shown in FIG. 3(d), resist material 3 is deposited over the entire surface of semiconductor substrate 2.

Then, as shown in FIG. 1, after semiconductor substrate 2 is rotated at a low velocity (about 800 rpm) for awhile, the rotational velocity of semiconductor substrate 2 is raised (to about 2900 rpm), and the thickness of the resist film is adjusted.

As explained in the above, in this embodiment, the semiconductor substrate is rotated at a high velocity of about 3000–3800 rpm so that the resist material 3 fed to the central portion of semiconductor substrate 2 when it is stopped will spread out smoothly towards the circumferential portion. Consequently, even a small amount of resist material can be deposited over the entire surface of semiconductor substrate 2 without unevenness.

Consequently, in this embodiment, it is possible to reduce the deposition amount of resist material 3 significantly (to about ⅓ that of the aforementioned conventional method), and it is possible to cut the cost of the manufacturing process of the semiconductor device significantly.

The present invention is not limited to the aforementioned embodiment, and various changes can be made.

For example, there is no limitation on the size of the semiconductor substrate to which the present invention can be applied. For example, in addition to 8-in semiconductor substrates, the present invention may also be applied to 5-in semiconductor substrates, 6-in semiconductor substrates, etc.

Also, various types of resist materials may be used, that is, both positive and negative type resist materials as well as various photoresists, resists for electron beam use, etc., can be used.

In the aforementioned embodiment, the resist material is fed when the semiconductor substrate is stopped. However, the present invention is not limited to this case. For example, it is possible to start feeding of the resist material while the semiconductor substrate is rotated at a low velocity (about 1000–1500 rpm), and the resist material is then fed while the velocity of the semiconductor substrate is raised to a high velocity (about 3000–3800 rpm).

REFERENCE NUMERALS AND SYMBOLS AS SHOWN IN THE DRAWINGS

1 Chuck; 2 Semiconductor substrate; 3 Resist material; 4 Arm; 5 Receiving portion; 6 Filter.

SPECIFICATION

TABLE I

Sequence of Embodiment

| Step | Time (sec) | Rotational velocity (rmp) | Depositing of resist |
|---|---|---|---|
| 1 | 1.0 | 1500 | — |
| 2 | 0.8 | 0 | ○ |
| 3 | 1.0 | 3700 | ○ |
| 4 | 0.4 | 800 | ○ |
| 5 | 1.0 | 800 | — |
| 6 | 20.0 | 2940 | — |

TABLE II

Sequence of Comparative Example

| Step | Time (sec) | Rotational velocity (rmp) | Depositing of resist |
|---|---|---|---|
| 1 | 1.0 | 1500 | — |
| 2 | 4.0 | 1500 | ○ |
| 3 | 1.0 | 800 | — |
| 4 | 20.0 | 2940 | — |

TABLE III

Sequence of Embodiment 2.

| Step | Time (sec) | Rotational velocity (rmp) | Depositing of resist |
|---|---|---|---|
| 1 | 20.0 | 1000 | — |
| 2 | 0.3 | 0 | ○ |
| 3 | 0.4 | 3000 | ○ |
| 4 | 0.3 | 1500 | ○ |
| 5 | 0.3 | 1000 | — |
| 6 | 25.0 | 2010 | — |

TABLE IV

Sequence of Comparative Example 2.

| Step | Time (sec) | Rotational velocity (rmp) | Depositing of resist |
|---|---|---|---|
| 1 | 1.0 | 1000 | — |
| 2 | 2.5 | 1000 | ○ |
| 3 | 0.3 | 1000 | — |
| 4 | 25.0 | 2030 | — |

TABLE V

Sequence of Embodiment 3.

| Step | Time (sec) | Rotational velocity (rmp) | Depositing of resist |
|---|---|---|---|
| 1 | 20.0 | 700 | — |
| 2 | 0.2 | 0 | ○ |
| 3 | 0.3 | 3000 | ○ |
| 4 | 0.2 | 1500 | ○ |
| 5 | 4.0 | 1500 | — |
| 6 | 3.0 | 4610 | — |
| 7 | 19.0 | 4610 | — |

TABLE VI

Sequence of Comparative Example 3.

| Step | Time (sec) | Rotational velocity (rmp) | Depositing of resist |
|------|------------|---------------------------|----------------------|
| 1 | 2.0 | 700 | — |
| 2 | 6.0 | 1500 | ○ |
| 3 | 0.5 | 1500 | — |
| 4 | 3.0 | 4800 | — |
| 5 | 19.0 | 4800 | — |

DESCRIPTION OF EMBODIMENTS

In the following, the present invention will be explained in more detail with reference to embodiments and comparative examples.

Embodiment 1

Using a deposition device TEL MK-8 manufactured by Tokyo Electron Co. Ltd., a resist material was deposited on an 8-in-diameter semiconductor substrate.

In this case, as the resist material, a solution prepared by dissolving IP3100 (viscosity of 9 cP) mainly made of novolac resin and manufactured by Tokyo Oka Kogyo K.K. in MMP (methyl-3-methoxypropionate) as the solvent was used. The resist material was deposited in the order given in Table I. Also, in this table, O indicates feeding of the resist material.

As listed in Table I, first the semiconductor substrate was rotated at 1500 rpm for 1.0 sec (step 1) to remove dust adhered to the semiconductor substrate. The rotational velocity of the semiconductor substrate was then reduced and the rotation was finally stopped. Then, feeding of the resist material to the central portion of the semiconductor substrate was started (step 2).

Then, after 0.8 sec, the semiconductor substrate was rotated at 3700 rpm for 1.0 sec (step 3). Then, as feeding of the resist material was continued, the rotational velocity of the semiconductor substrate was reduced to 800 rpm, at which velocity the semiconductor substrate was rotated for about 0.4 sec. 3.2 sec after the start of the operation, feeding of the resist material was stopped (step 4).

After the semiconductor substrate was rotated at 800 rpm for 1.0 sec (step 5), the rotational velocity of the semiconductor substrate was raised to 2940 rpm and the thickness of the resist film was adjusted (step 6).

Table I

In Embodiment 1, 2.0 $cm^3$ of resist material was used to form a 1.03-$\mu$m-thick resist film on the semiconductor substrate.

Comparative Example 1

The same device and resist material as those used in Embodiment 1 were used to deposit the resist material on an 8-in-diameter semiconductor substrate in the order given in Table II.

As listed in Table II, first the semiconductor substrate was rotated at 1500 rpm for 1.0 sec (step 1) to remove the dust adhered to the semiconductor substrate. Then, as the semiconductor substrate was rotated at the same rotational velocity, the resist material was fed for 4.0 sec to the central portion of the semiconductor substrate. Then, feeding of the resist material was stopped (step 2).

Then, the rotational velocity of the semiconductor substrate was reduced to 800 rpm and the semiconductor substrate was rotated for 1.0 sec. Then, the rotational velocity was raised to 2940 rpm to adjust the thickness of the resist film (step 4).

Table II

In the case of Comparative Example 1, in order to ensure that no unevenness takes place, it is necessary to use 8 $cm^3$ of resist material.

Embodiment 2

Resist material was deposited on a 6-in-diameter semiconductor substrate with deposition device TEL MK-5 manufactured by Tokyo Electron Co. Ltd.

In this case, as the resist material, a solution prepared by dissolving PFI-34A (viscosity of 9 cP) mainly made of novolac resin and manufactured by Sumitomo Chemical Co. Ltd. In MAK (methyl-n-amylketone-2-heptanone) as the solvent was used. The resist material was deposited in the order given in Table III.

As listed in Table III, first the semiconductor substrate was rotated at 1000 rpm for 20.0 sec (step 1). Then, the rotational velocity of the semiconductor substrate was reduced and the rotation was finally stopped. Then, feeding of the resist material to the central portion of the semiconductor substrate was started (step 2).

Then, after 0.3 sec, the semiconductor substrate was rotated at 3000 rpm for 0.4 sec (step 3). Then, as feeding of the resist material was continued, the rotational velocity of the semiconductor substrate was reduced to 1500 rpm, at which velocity the semiconductor substrate was rotated for about 0.3 sec. 21.0 sec after the start of the operation, the feeding of the resist material was stopped (step 4).

After the semiconductor substrate was rotated at 1000 rpm for 0.3 sec (step 5), the rotational velocity of the semiconductor substrate was raised to 2010 rpm and the thickness of the resist film was adjusted (step 6).

Table III

In Embodiment 2, by using 1.0 $cm^3$ of the resist material, a 1.45-$\mu$m-thick resist film was formed on the semiconductor substrate.

Comparative Example 2

The same device and resist material as those used in Embodiment 2 were used to deposit the resist material on a 6-in-diameter semiconductor substrate in the order given in Table IV.

As listed in Table IV, first the semiconductor substrate was rotated at 1000 rpm for 1.0 sec (step 1). Then, as the semiconductor substrate was rotated at this rotational velocity, the resist material was fed for 2.5 sec to the central portion of the semiconductor substrate. Then, feeding of the resist material was stopped (step 2).

The semiconductor substrate was then rotated at 1500 rpm for 0.3 sec (step 3). Then, the rotational velocity was raised to 2030 rpm to adjust the thickness of the resist film (step 4).

Table IV

In the case of Comparative Example 2, in order to ensure that no coating unevenness takes place, it is necessary to use 3 $cm^3$ of resist material.

Embodiment 3

Using the same device as that used in Embodiment 2, resist material was coated on a 5-in-diameter semiconductor substrate.

In this case, as the resist material, a solution prepared by dissolving PF-D30B (viscosity of 28 cP) mainly made of novolac resin and manufactured by Sumitomo Chemical Co. Ltd. in MAK as the solvent was used. The resist material was deposited in the order given in Table V.

As listed in Table V, first the semiconductor substrate was rotated at 700 rpm for 20.0 sec (step 1). The rotational velocity of the semiconductor substrate was then lowered and the rotation finally stopped. Then, feeding of the resist material to the central portion of the semiconductor substrate was started (step 2).

Then, after 0.2 sec, the semiconductor substrate was rotated at 3000 rpm for 0.3 sec (step 3). Then, while feeding of the resist material was continued, the rotational velocity of the semiconductor substrate was lowered to 1500 rpm, at which velocity the semiconductor substrate was rotated for about 0.2 sec. 20.7 sec after the start of the operation, feeding of the resist material was stopped (step 4).

After the semiconductor substrate was rotated at 1500 rpm for 4.0 sec (step 5), the rotational velocity of the semiconductor substrate was raised to 4610 rpm (step 6), and then the thickness of the resist film was then adjusted (step 7).

Table V

In Embodiment 3, by using 0.7 cm$^3$ of resist material, a 1.85-$\mu$m-thick resist film was formed on the semiconductor substrate.

Comparative Example 3

The same device and resist material as those used in Embodiment 3 were used to deposit the resist material on a 5-in-diameter semiconductor substrate in the order given in Table VI.

As listed in Table VI, first the semiconductor substrate was rotated at 700 rpm for 2.0 sec (step 1). After the rotational velocity of the semiconductor substrate was raised to 1500 rpm, the resist material was then fed for 6.0 sec to the central portion of the semiconductor substrate for deposition. Then, feeding of the resist material was stopped (step 2).

The semiconductor substrate was then rotated at 1500 rpm for 0.5 sec (step 3). The rotational velocity was then raised to 4800 rpm (step 4), and the thickness of the resist film was adjusted (step 5).

Table VI

In the case of Comparative Example 3, in order to ensure that no unevenness takes place, it is necessary to use 3 cm$^3$ of resist material.

As described above, according to the invention of claim 1, the resist material fed to the central portion of the semiconductor substrate in the first processing step spreads out smoothly toward the circumferential portion of the semiconductor substrate in the second processing step as the semiconductor substrate is rotated at high velocity. Consequently, even a small amount of resist material can be deposited over the entire surface of the semiconductor substrate without unevenness.

In this case, according to the invention of claim 2, as the semiconductor substrate is rotated at a velocity of 3000 rpm or more in the second processing step, the resist material can be coated over the entire surface of the semiconductor substrate more reliably.

On the other hand, according to the invention of claim 3, the semiconductor substrate is not rotated in the first processing step, and, according to claim 4, the semiconductor substrate is rotated at a velocity in the range of 1000–1500 rpm in the first processing step. In both cases, the semiconductor substrate is rotated at a velocity of 3000 rpm or more in the second processing step, so that the resist material is deposited over the entire surface of the semiconductor substrate more reliably.

In this way, according to the present invention, it is possible to reduce significantly the amount of resist material deposited, and hence the cost of the manufacturing process of the semiconductor device.

We claim:

1. A method of depositing a resist material on a semiconductor wafer comprising the steps of:

placing a resist material at a central portion of said semiconductor wafer;

spinning said wafer at a first speed for a first predetermined time;

spinning said wafer at a second speed which is less than said first speed for a second predetermined time; and spinning said wafer at a third speed, said third speed being between said first and second speeds for a third predetermined time, whereby said resist material is evenly spread across said wafer.

2. The method of claim 1 further comprising the step of spinning said wafer at a fourth speed for a fourth predetermined time before said placing step for removing dust on said wafer.

3. The method of claim 2 wherein said first speed is in the range of substantially 3000–3800 rpm.

4. The method of claim 3 wherein said second speed is substantially 800 rpm.

5. The method of claim 4 wherein said third speed is substantially 2900 rpm.

6. The method of claim 2 wherein said second speed is substantially 800 rpm.

7. The method of claim 6 wherein said third speed is substantially 2900 rpm.

8. The method of claim 3 wherein said third speed is substantially 2900 rpm.

9. The method of claim 2 wherein said third speed is substantially 2900 rpm.

10. The method of claim 2 wherein said semiconductor wafer is rotated at a speed in the range of substantially 1000–1500 rpm during said placing step.

11. The method of claim 1 wherein said first speed is in the range of substantially 3000–3800 rpm.

12. The method of claim 11 wherein said second speed is substantially 800 rpm.

13. The method of claim 12 wherein said third speed is substantially 2900 rpm.

14. The method of claim 11 wherein said third speed is substantially 2900 rpm.

15. The method of claim 11 wherein said semiconductor wafer is rotated at a speed in the range of substantially 1000–1500 rpm during said placing step.

16. The method of claim 1 wherein said second speed is substantially 800 rpm.

17. The method of claim 16 wherein said third speed is substantially 2900 rpm.

18. The method of claim 16 wherein said semiconductor wafer is rotated at a speed in the range of substantially 1000–1500 rpm during said placing step.

19. The method of claim 1 wherein said third speed is substantially 2900 rpm.

20. The method of claim 19 wherein said semiconductor wafer is rotated at a speed in the range of substantially 1000–1500 rpm during said placing step.

21. The method of claim 1 wherein said semiconductor wafer is rotated at a speed in the range of substantially 1000–1500 rpm during said placing step.

* * * * *

UNITED STATES PATENT AND TRADEMARK OFFICE
CERTIFICATE OF CORRECTION

PATENT NO. : 5,968,592 C1
APPLICATION NO. : 90/007352
DATED : July 17, 2007
INVENTOR(S) : Yoshida et al.

It is certified that error appears in the above-identified patent and that said Letters Patent is hereby corrected as shown below:

Claim 29, column 2, lines 5-6 reads "first constant speed" and should be changed to read --first speed--.

Claim 29, column 2, lines 19 - 20 reads "during at least each of said first and second" and should be changed to read --during said first and second--.

Claim 37, column 2, line 59 reads "during at least each of said first and second" and should be changed to read --during said first and second--.

Claim 45, column 3, line 17 reads "first constant speed" and should be changed to read --first speed--.

Claim 45, column 4, line 3 reads "during at least each of said first and second" and should be changed to read --during said first and second--.

Signed and Sealed this

Thirteenth Day of November, 2007

JON W. DUDAS
*Director of the United States Patent and Trademark Office*

(12) EX PARTE REEXAMINATION CERTIFICATE (5814th)
United States Patent
Yoshida et al.

(10) Number: US 5,968,592 C1
(45) Certificate Issued: Jul. 17, 2007

(54) MULTI STEP COAT (75) Inventors: Masataka Yoshida, Tokyo (JP); Tomoaki Mekata, Tsuchiura (JP)

(73) Assignee: Texas Instruments Incorporated, Dallas, TX (US)

Reexamination Request:
No. 90/007,352, Dec. 22, 2004

Reexamination Certificate for:
Patent No.: 5,968,592
Issued: Oct. 19, 1999
Appl. No.: 08/929,263
Filed: Sep. 11, 1997

(30) Foreign Application Priority Data

Sep. 13, 1996 (JP) .............................. 8-265476

(51) Int. Cl.
*B05D 1/00* (2006.01)
*G03F 7/16* (2006.01)

(52) U.S. Cl. ..................................... 438/758; 427/385.5
(58) Field of Classification Search .................... None
See application file for complete search history.

(56) References Cited

U.S. PATENT DOCUMENTS

| 4,451,507 | A | 5/1984 | Beltz et al. |
| 4,518,678 | A | 5/1985 | Allen |
| 4,741,926 | A | 5/1988 | White et al. |
| 4,748,053 | A | 5/1988 | Okada |
| 5,395,803 | A | 3/1995 | Adams |
| 5,405,813 | A | 4/1995 | Rodrigues |
| 5,532,192 | A | 7/1996 | Adams |
| 5,658,615 | A | 8/1997 | Hasebe et al. |
| 5,677,001 | A | 10/1997 | Wang et al. |
| 5,773,083 | A | 6/1998 | Fischer et al. |
| 5,837,319 | A | 11/1998 | Walters et al. |
| 5,843,527 | A | 12/1998 | Sanada |
| 6,214,104 | B1 | 4/2001 | Iida et al. |
| 6,277,441 | B1 | 8/2001 | Endo et al. |

FOREIGN PATENT DOCUMENTS

| JP | 62-190838 | | 8/1987 |
| JP | 63034925 | A | 2/1988 |
| JP | 63313160 | A | 12/1988 |
| JP | 2-126970 | | 5/1990 |
| JP | 03245875 | A | 11/1991 |
| JP | 7227567 | A | 8/1995 |
| JP | 07227568 | A | 8/1995 |
| JP | 7-235479 | | 9/1995 |

OTHER PUBLICATIONS

Translation of JP 07–227567.*

* cited by examiner

*Primary Examiner*—Kiley Stoner (57) ABSTRACT

The objective of the invention is to provide a resist material deposition method which allows reliable deposition using a small amount of resist material without unevenness.

The method of the present invention comprises the following processing steps: a first processing step in which the resist material is fed to the central portion of the semiconductor substrate, and a second processing step in which the aforementioned semiconductor substrate is rotated at a high velocity so that the aforementioned resist material spreads out smoothly toward the circumferential portion of the aforementioned semiconductor substrate. In the first processing step, the semiconductor substrate is rotated at a velocity in the range of 1000-1500 rpm; in the second processing step, the semiconductor substrate is rotated at a velocity in the range of 3000-3800 rpm.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 2 are determined to be patentable as amended.

Claims 3-21, dependent on an amended claim, are determined to be patentable.

New claims 22-52 are added and determined to be patentable.

1. A method of depositing a resist material on a semiconductor wafer comprising the steps of:
   [placing a resist material at a central portion of said semiconductor wafer;]
   spinning said *semiconductor* wafer at a first speed for a first predetermined time;
   *placing a resist material at a central portion of said semiconductor wafer when said semiconductor wafer is spinning at said first speed;*
   spinning said *semiconductor* wafer at a second speed which is less than said first speed for a second predetermined time; and
   spinning said *semiconductor* wafer at a third speed *after said second predetermined time*, said third speed being between said first and second speeds for a third predetermined time, whereby said resist material is evenly spread across said wafer *during said first and second predetermined times*.

2. The method of claim 1 further comprising the step of spinning said *semiconductor* wafer at a fourth speed for a fourth predetermined time before said placing step for removing dust on said *semiconductor* wafer.

22. *The method of claim 2 wherein said fourth speed is less than said first speed.*

23. *The method of claim 1 wherein said first speed is greater than or equal to 3000 rpm.*

24. *The method of claim 1 wherein said second speed is less than or equal to 1500 rpm.*

25. *The method of claim 1 wherein said spinning at said third speed commences within about 2.4 seconds after the start of said spinning at said first speed.*

26. *The method of claim 1 wherein said placing step includes placing a resist material at a central portion of said semiconductor wafer before said semiconductor wafer is spinning at said first speed and wherein said spinning at said third speed commences within about 3.2 seconds after the start of said placing of said resist material.*

27. *The method of claim 1 wherein each of said first and second times have a duration of between about 0.3 and 1.4 seconds.*

28. *The method of claim 1 wherein spinning said semiconductor wafer at said first speed begins during said placing step.*

29. *A method of depositing a resist material on a semiconductor wafer comprising the steps of:*
   *spinning said semiconductor wafer at a fourth speed for a fourth predetermined time;*
   *spinning said semiconductor wafer at a first constant speed for a first predetermined time after spinning said semiconductor wafer at said fourth speed;*
   *spinning said semiconductor wafer at a second speed which is less than said first speed for a second predetermined time after spinning said semiconductor wafer at said first speed;*
   *spinning said semiconductor wafer at a third speed after spinning said semiconductor wafer at said second speed, said third speed being between said first and second speeds for a third predetermined time; and*
   *placing a resist material at a central portion of said semiconductor wafer when said semiconductor wafer is spinning at said first speed, whereby said resist material is evenly spread across said wafer during at least each of said first and second predetermined times.*

30. *The method of claim 29 wherein said first speed is greater than or equal to 3000 rpm.*

31. *The method of claim 29 wherein said second speed is less than or equal to 1500 rpm.*

32. *The method of claim 29 wherein said spinning at said third speed commences within about 2.4 seconds after the start of said spinning at said first speed.*

33. *The method of claim 29 wherein said spinning at said third speed commences within about 3.2 seconds after the start of said placing of said resist material.*

34. *The method of claim 29 wherein each of said first and second times have a duration of between about 0.3 and 1.4 seconds.*

35. *The method of claim 29 wherein spinning said semiconductor wafer at said first speed begins during said placing step.*

36. *The method of claim 29 wherein said fourth speed is less than the first speed.*

37. *A method of depositing a resist material on a semiconductor wafer comprising the steps of:*
   *spinning said semiconductor wafer at a fourth speed;*
   *stopping spinning said semiconductor wafer after spinning said semiconductor wafer at a fourth speed;*
   *placing a resist material at a central portion of said semiconductor wafer after the step of stopping spinning while said semiconductor wafer is not spinning;*
   *spinning said semiconductor wafer at a first speed for a first predetermined time after beginning said placing step;*
   *spinning said semiconductor wafer at a second speed which is less than said first speed for a second predetermined time after spinning said semiconductor wafer at said first speed; and*
   *spinning said semiconductor wafer at a third speed after spinning said semiconductor wafer at said second speed, said third speed being between said first and second speeds for a third predetermined time, whereby said resist material is evenly spread across said wafer during at least each of said first and second predetermined times.*

38. *The method of claim 37 wherein said first speed is greater than or equal to 3000 rpm.*

39. *The method of claim 37 wherein said second speed is less than or equal to 1500 rpm.*

40. *The method of claim 37 wherein said spinning at said third speed commences within about 2.4 seconds after the start of said spinning at said first speed.*

41. The method of claim 37 wherein said spinning at said third speed commences within about 3.2 seconds after the start of said placing of said resist material.

42. The method of claim 37 wherein each of said first and second times have a duration of between about 0.3 and 1.4 seconds.

43. The method of claim 37 wherein said fourth speed is less than said first speed.

44. The method of claim 37 wherein spinning said semiconductor wafer at said first speed begins during said placing step.

45. A method of depositing a resist material on a semiconductor wafer comprising the steps of:

placing a resist material at a central portion of said semiconductor wafer;

spreading said resist material by spinning said semiconductor wafer at a first constant speed for a first predetermined time during at least a portion of said placing step;

reducing said first speed to a second speed and spinning said semiconductor wafer at said second speed for a second predetermined time; and increasing said second speed to a third speed and spinning said semiconductor wafer at said third speed for a third predetermined time, said third speed being between said first and second speeds, whereby said resist material is evenly spread across said wafer during at least each of said first and second predetermined times.

46. The method of claim 45 wherein said first speed is greater than or equal to 3000 rpm.

47. The method of claim 45 wherein said second speed is less than or equal to 1500 rpm.

48. The method of claim 45 wherein said spinning at said third speed commences within about 2.4 seconds after the start of said spinning at said first speed.

49. The method of claim 45 wherein said spinning at said third speed commences within about 3.2 seconds after the start of said placing of said resist material.

50. The method of claim 45 wherein each of said first and second times have a duration of between about 0.3 and 1.4 seconds.

51. The method of claim 45 further comprising the step of spinning said semiconductor wafer at a fourth speed less than the first speed for a fourth predetermined time before said first predetermined time.

52. The method of claim 45 wherein spinning said semiconductor wafer at said first speed begins during said placing step.

\* \* \* \* \*